United States Patent
Rao et al.

(10) Patent No.: US 8,492,236 B1
(45) Date of Patent: Jul. 23, 2013

(54) STEP-LIKE SPACER PROFILE

(75) Inventors: Xuesong Rao, Singapore (SG); Chim Seng Seet, Singapore (SG); Hai Cong, Singapore (SG); Zheng Zou, Singapore (SG); Alex See, Singapore (SG); Yun Ling Tan, Singapore (SG); Wen Zhan Zhou, Singapore (SG); Lup San Leong, Singapore (SG); Huang Liu, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/348,766

(22) Filed: Jan. 12, 2012

(51) Int. Cl.
  *H01L 21/336* (2006.01)
(52) U.S. Cl.
  USPC ............................ 438/303; 438/230; 438/595
(58) Field of Classification Search
  USPC .. 438/230, 303, 305, 595, 596, 696; 257/336, 257/408, 344
  See application file for complete search history.

(56) References Cited

U.S. PATENT DOCUMENTS

| | | | | |
|---|---|---|---|---|
| 5,994,227 | A * | 11/1999 | Matsuo et al. | 438/696 |
| 6,498,067 | B1 * | 12/2002 | Perng et al. | 438/305 |
| 6,943,077 | B2 * | 9/2005 | Liu et al. | 438/230 |
| 7,314,793 | B2 * | 1/2008 | Frohberg et al. | 438/230 |

* cited by examiner

*Primary Examiner* — Kevin M Picardat
(74) *Attorney, Agent, or Firm* — Ditthavong Mori & Steiner, P.C.

(57) ABSTRACT

Interlayer dielectric gap fill processes are enhanced by forming gate spacers with a step-like or tapered profile. Embodiments include forming a gate electrode on a substrate, depositing a spacer material over the gate electrode, etching the spacer material to form a first spacer on each side of the gate electrode, and pulling back the first spacers to form second spacers which have a step-like profile. Embodiments further include depositing a second spacer material over the gate electrode and the second spacers, and etching the second spacer material to form a third spacer on each second spacer, the second and third spacers forming an outwardly tapered composite spacer.

20 Claims, 5 Drawing Sheets

STEP-LIKE SPACER PROFILE

TECHNICAL FIELD

The present disclosure relates to methods for forming semiconductor gate spacers having a tapered or step-like profile. The present disclosure is particularly applicable to 40 nanometer (nm) technology nodes and beyond.

BACKGROUND

As the dimensions of semiconductor devices continue to shrink, the spacing between adjacent polysilicon gates decreases, the aspect ratio of the gaps between the gates increases, and filling of the gaps with a dielectric material becomes very challenging. As the gaps are actually formed between spacers of adjacent gates, the spacer profile is a key factor in a high-quality gap fill. Conventional spacers generally result in a substantially uniform gap width, leading to voids in the filled dielectric material. Voids in the interlayer dielectric (ILD) may cause shorts between drain contacts or between source contacts, thereby degrading device performance.

Achieving a void-free gap fill of dielectric material is particularly difficult between double-poly gates, for example having a height about 200 nanometers (nm), with tight spacing, e.g. having a minimum spacing of 108 nm, in a typical embedded non-volatile memory (eNVM) process flow. Adverting to FIG. 1A, each gate 101 includes a sidewall spacer 103 having an upper portion 105 and a lower portion 107. The lower portion may be characterized by sidewall angle 109, space 111, and height 113. As illustrated in FIG. 1B, when an ILD 115 is deposited over and between two adjacent gates 101, a void 117 is formed. Current process flows, such as deposition of a low temperature oxide (LTO) 201 to a thickness of 500 angstroms (Å) over gate 203 (as illustrated in FIG. 2A) followed by etching, produce a sidewall spacer profile 205 (as illustrated in FIG. 2B) with a large, substantially vertical, lower portion 207, for example having a height of 120 nm to 180 nm. The significant vertical portion is not favored by current ILD gap fill processes, such as a high aspect ratio process (HARP), causing formation of voids 117 during ILD gap fill.

A need therefore exists for methodology enabling formation of gate spacers having a tapered or step-like profile, and the resulting device.

SUMMARY

An aspect of the present disclosure is a method of forming a semiconductor device having gate spacers with a step-like or tapered profile.

Another aspect of the present disclosure is semiconductor device having gate spacers with a step-like or tapered profile.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a gate electrode on a substrate; depositing a spacer material over the gate electrode; etching the spacer material to form a first spacer on each side of the gate electrode; and pulling back the first spacers to form second spacers.

Aspects of the present disclosure include depositing a second spacer material over the gate electrode and the second spacers; and etching the second spacer material to form a third spacer on each second spacer, the second and third spacers forming an outwardly tapered composite spacer. Further aspects include depositing low temperature oxides (LTO) for the first and second spacer materials. Other aspects include pulling back the first spacers by wet cleaning, such as by applying a dilute hydrogen fluoride (dHF). Another aspect includes etching the second spacer material by reactive ion etching (RIE). Additional aspects include a second wet cleaning; depositing a third spacer material over the gate electrodes, second spacers, and third spacers; and etching the third spacer material to form a fourth spacer on each third spacer, the second, third, and fourth spacers forming an outwardly tapered composite spacer. Further aspects include depositing a resist, such as a spin-on resist, on the gate electrode and first spacers; and etching away a portion of the resist prior to pulling back the first spacers. Other aspects include pulling back the first spacers by wet etching and stripping the resist.

Another aspect of the present disclosure is a device including: a substrate; a gate electrode on the substrate; and a spacer on each side of the gate electrode, wherein each spacer has a tapered or step-like profile.

Aspects include each spacer having a height less than a height of the gate electrode. Further aspects include each spacer including: a first spacer having a height less than a height of the gate electrode; and a second spacer, on the first spacer. Another aspect includes the first and second spacers each being formed of an LTO. Other aspects include the first and second spacers each having a width of 50 Å to 250 Å. Additional aspects include each spacer being a composite spacer of three to five spacers, the spacer closest to the gate electrode having a height less than a height of the gate electrode, and the composite spacer having substantially no vertical portion.

Another aspect of the present disclosure is a method including: forming at least two gate electrodes on a substrate; depositing a low temperature oxide (LTO) over the gate electrodes; etching the LTO to form a first spacer on each side of each gate electrode; pulling back the first spacers to form second spacers, wherein a profile of the second spacers is more angled than a profile of the first spacers; and depositing an interlayer dielectric (ILD) on and between the at least two gate electrodes.

Aspects include pulling back the first spacers by: depositing a spin-on resist on the gate electrodes and first spacers; etching away a portion of the spin-on resist; wet etching; and stripping the spin-on resist. Other aspects include the first spacers being pulled back by wet cleaning by applying a dilute hydrogen fluoride (dHF), the method further including: depositing a second LTO over the gate electrode and the second spacers; and reactive ion etching (RIE) the second LTO to form a third spacer on each second spacer, the second and third spacers forming an outwardly tapered composite spacer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure.

Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of void formation attendant upon current gap fill processes between adjacent semiconductor gates. In accordance with embodiments of the present disclosure, gate spacers are formed with a tapered profile or with a step-like profile to minimize the vertical portion therebetween. The resulting gap has a large opening in the upper portion and a narrow gap in the lower portion, thereby reducing void formation during gap filling.

Methodology in accordance with embodiments of the present disclosure includes forming a gate electrode on a substrate, depositing a spacer material over the gate electrode, etching the spacer material to form a first spacer on each side of the gate electrode, and pulling back the first spacers to form second spacers.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
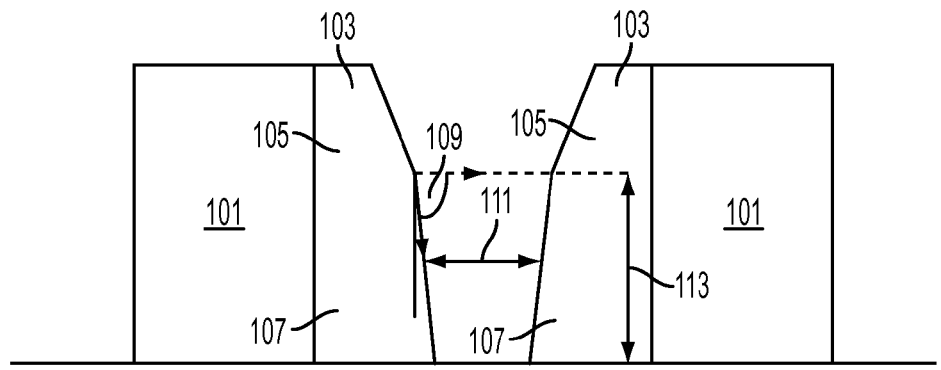
FIGS. 1A and 1B schematically illustrate a model for current ILD gap fill.
Figure 1B:
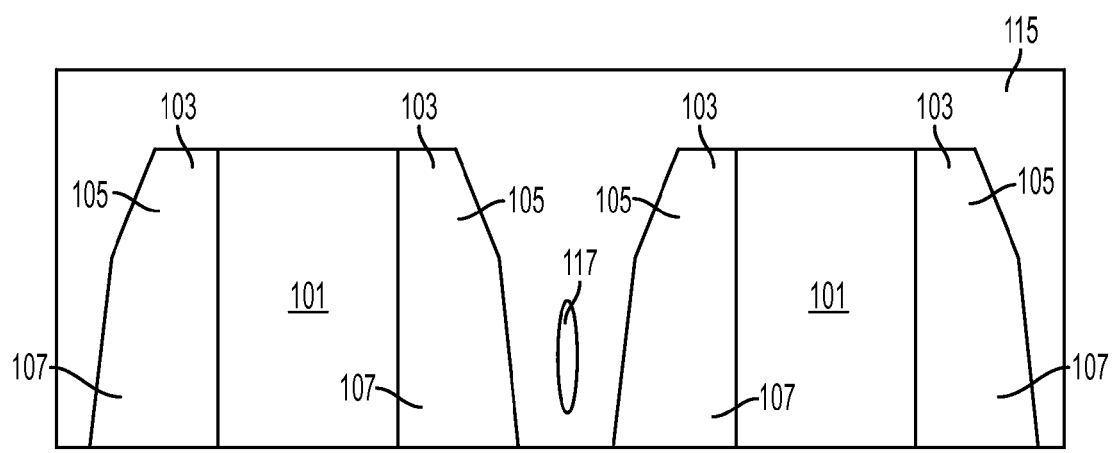
Figure 2A:
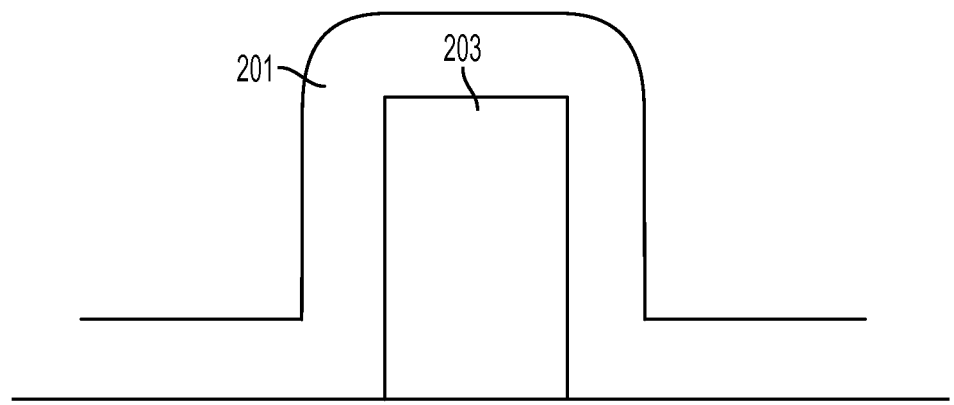
FIGS. 2A and 2B schematically illustrate a current process flow for forming gate spacers.
Figure 2B:
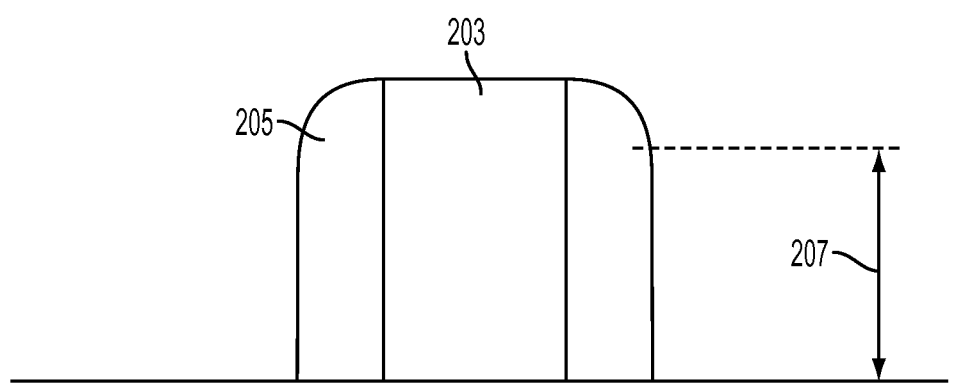

The initial process flow in accordance with an exemplary embodiment is the same as that illustrated in FIGS. 2A and 2B. Specifically, an LTO layer 201 is deposited over gate 203 to a thickness of 100 Å to 500 Å followed by a reactive ion etch (RIE) to form spacers 205. Gate 203 may, for example, be part of a high voltage (HV) transistor or may be part of an eNVM formed on the same chip. Spacers 205 have a width of 100 Å to 500 Å and a substantially vertical lower portion having a height of 120 nm to 180 nm, in which a larger spacer width corresponds to a shorter lower portion and a more tapered profile.

Figure 3:
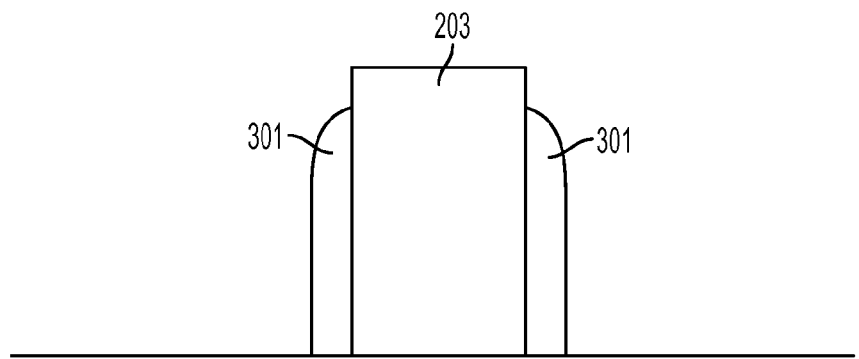
FIGS. 3 through 5 schematically illustrate a process flow for fabricating a semiconductor device having gate spacers with a tapered profile, in accordance with an exemplary embodiment.

Adverting to FIG. 3, the spacers are then pulled back, for example by etching, to about half the spacer width, for example to a width of 50 Å to 250 Å, to form spacers 301. The etching may be performed with a wet clean step, for example using diluted hydrofluoric acid (dHF). The wet clean not only reduces the spacer width, but also reduces the spacer height. For example, 200 Å of dHF will correspondingly reduce the spacer height by 200 Å.

Figure 4:
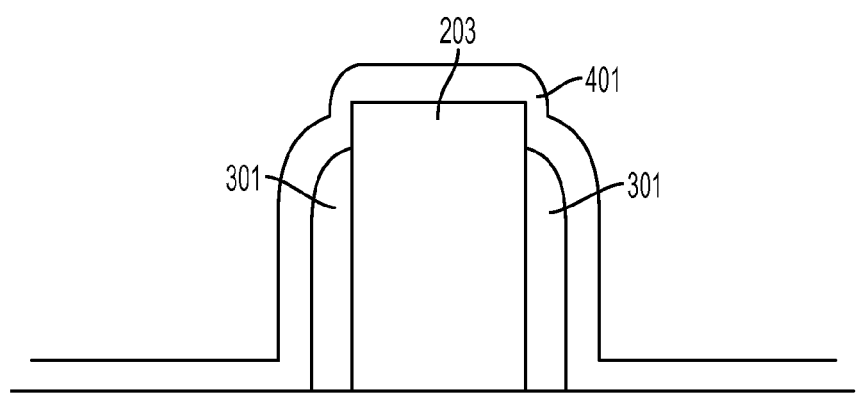

As illustrated in FIG. 4, a second LTO layer 401 is deposited over spacers 301 and gate 203. LTO layer 401 may be deposited to a thickness of 50 Å to 250 Å, for example 250 Å.

Figure 5:
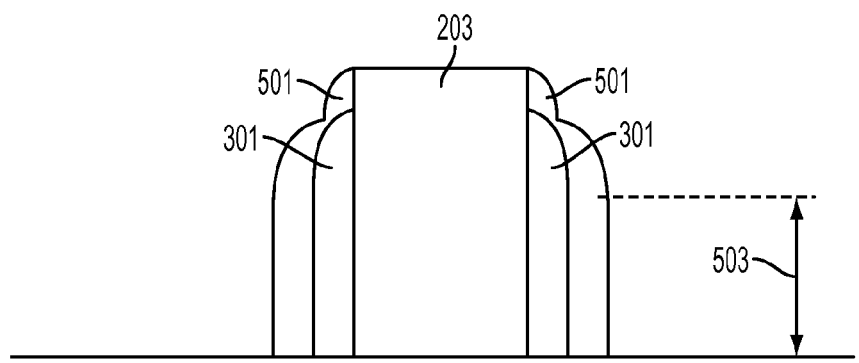

A second spacer RIE is then performed, forming spacers 501, as illustrated in FIG. 5. The resulting spacers have a lower portion 503 having a height of 60 nm to 120 nm, which is less than current spacers, and a sidewall angle between 60° and 90°, which is more tapered and gap-fill friendly than current spacers. The minimum space between adjacent spacers may be less than 10 nm. A stress proximity technique (SPT) may also be applied after formation of the spacers. The longer the SPT, the larger the spacing and the better the profile for the lower part of the gap for a subsequent ILD deposition. In other words, a longer SPT improves the ILD gap fill. The steps illustrated in FIGS. 3 through 5 may be repeated multiple times, for example one to three times, to further reduce the vertical portion of the spacers.

Figure 6:
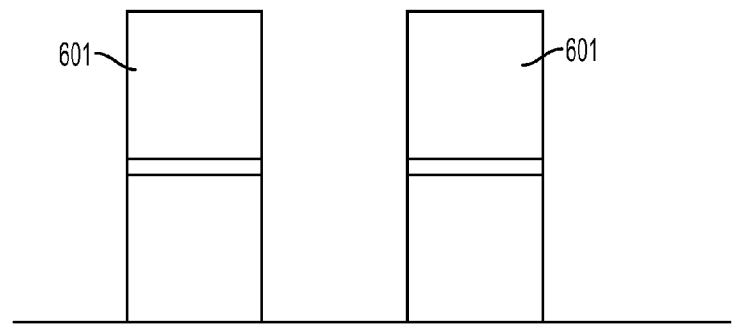
FIGS. 6 through 11 schematically illustrate a process flow for fabricating a semiconductor device having gate spacers with a step-like profile, in accordance with another exemplary embodiment.
Figure 7:
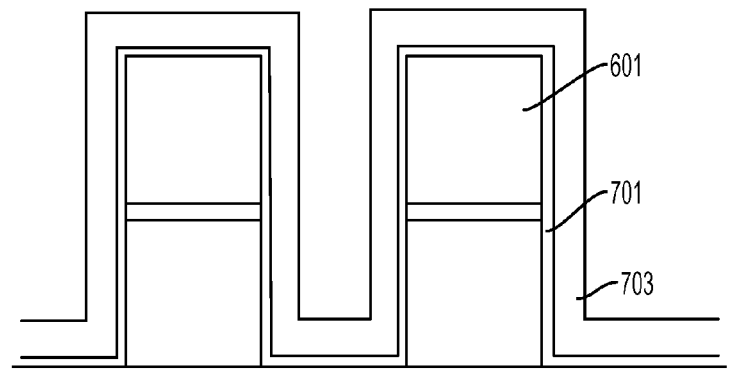
Figure 8:
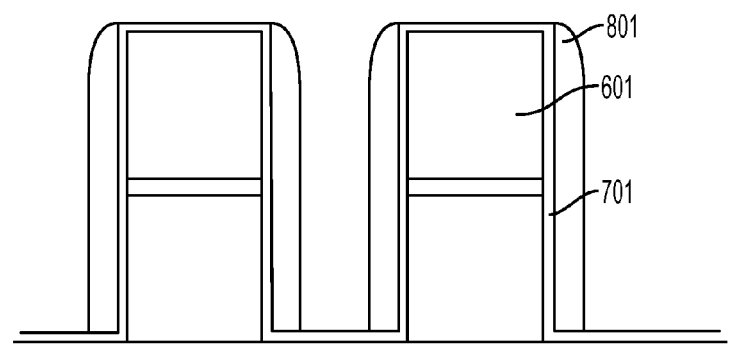
Figure 9:
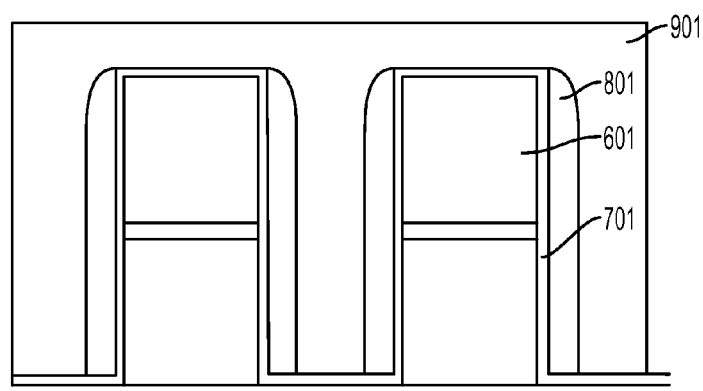
Figure 10:
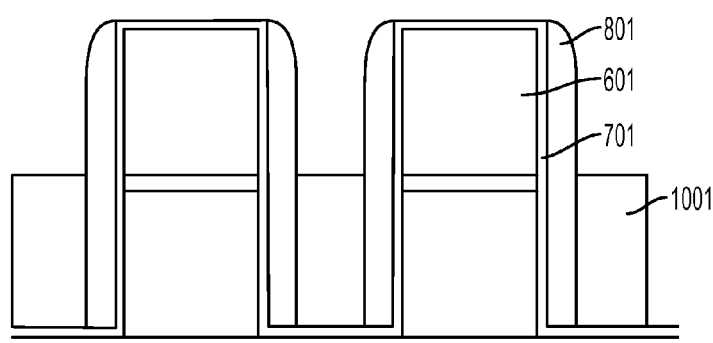
Figure 11:
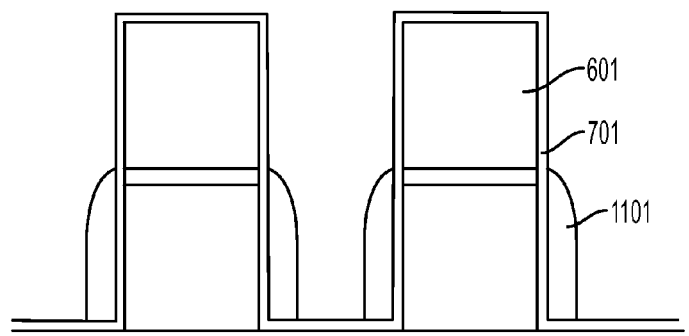

Adverting to FIGS. 6 through 11, a process flow for forming spacers with a shorter lower portion in accordance with another exemplary embodiment is illustrated. FIGS. 6 through 8 illustrate a conventional process flow, and FIGS. 9 through 11 show the additional steps in accordance with the exemplary embodiment. As shown in FIG. 6, double poly gates 601 are each formed with a top control gate (CG), a bottom floating gate (FG), and an oxide-nitride-oxide (ONO) layer therebetween.

As illustrated in FIG. 7, a thin etch stop layer 701, is formed over gates 601 to a thickness of, for example, 300 Å. Over etch stop layer 701, a layer of spacer material 703 may be deposited, to a thickness of 5 nm to 15 nm. Spacer material layer 703 may, for example, be formed of an LTO. The LTO is then etched, for example by RIE, as illustrated in FIG. 8, forming spacers 801. As shown, conventional spacers 801 have a large vertical portion, for example 120 nm to 180 nm.

Adverting to FIG. 9, the gates 601 are covered with a spin-on resist 901. Resist 901 may then be etched back to a height of 40 nm to 120 nm forming resist portions 1001. A wet etch, for example by application of dHF, is performed, and the spin-on resist is stripped, forming spacers 1101 having a height of 40 nm to 120 nm, with a vertical portion of 30 nm to 110 nm. As a result, spacers 1101 have a more tapered profile than conventional spacers 801, making them more favorable for the subsequent ILD gap fill process.

The embodiments of the present disclosure can achieve several technical effects, including reducing the vertical portion of gate spacers, thereby facilitating ILD gap fill and reducing ILD voids. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a gate electrode on a substrate;
   depositing a low temperature oxide (LTO) spacer material over the gate electrode;
   etching the LTO spacer material to form a first spacer on each side of the gate electrode; and
   pulling back the first spacers to form second spacers.

2. The method according to claim 1, further comprising:
   depositing a second spacer material over the gate electrode and the second spacers; and
   etching the second spacer material to form a third spacer on each second spacer, the second and third spacers forming an outwardly tapered composite spacer.

3. The method according to claim 2, comprising depositing low temperature LTO for the second spacer material.

4. The method according to claim 3, comprising pulling back the first spacers by wet cleaning.

5. The method according to claim 4, comprising wet cleaning by applying a dilute hydrogen fluoride (dHF).

6. The method according to claim 5, comprising etching the second spacer material by reactive ion etching (RIE).

7. The method according to claim 6, further comprising:
   a second wet cleaning;
   depositing a third spacer material over the gate electrodes, second spacers, and third spacers; and
   etching the third spacer material to form a fourth spacer on each third spacer, the second, third, and fourth spacers forming an outwardly tapered composite spacer.

8. The method according to claim 1, further comprising:
   depositing a resist on the gate electrode and first spacers; and
   etching away a portion of the resist prior to pulling back the first spacers.

9. The method according to claim 8, comprising pulling back the first spacers by wet etching and stripping the resist.

10. The method according to claim 9, wherein the resist comprises a spin-on resist.

11. The method according to claim 8, comprising pulling back the first spacers to a height of 40 nm to 120 nm and having a vertical portion having a height of 30 nm to 110 nm.

12. A device comprising:
    a substrate;
    a gate electrode on the substrate; and
    a spacer comprising a low temperature oxide (LTO) on each side of the gate electrode,
    wherein each spacer has a tapered or step-like profile.

13. The device according to claim 12, wherein each spacer has a height less than a height of the gate electrode.

14. The device according to claim 12, wherein each spacer comprises:
    a first spacer having a height less than a height of the gate electrode; and
    a second spacer, on the first spacer.

15. The device according to claim 14, wherein the second spacers each comprise a LTO.

16. The device according to claim 15, wherein the first and second spacers each have a width of 50 Å to 250 Å.

17. The device according to claim 12, wherein each spacer comprises a composite spacer of three to five spacers, the spacer closest to the gate electrode having a height less than a height of the gate electrode, and the composite spacer having substantially no vertical portion.

18. A method comprising:
    forming at least two gate electrodes on a substrate;
    depositing a low temperature oxide (LTO) over the gate electrodes;
    etching the LTO to form a first spacer on each side of each gate electrode;
    pulling back the first spacers to form second spacers, wherein a profile of the second spacers is more angled than a profile of the first spacers; and
    depositing an interlayer dielectric (ILD) on and between the at least two gate electrodes.

19. The method according to claim 18, comprising pulling back the first spacers by:
    depositing a spin-on resist on the gate electrodes and first spacers;
    etching away a portion of the spin-on resist;
    wet etching; and
    stripping the spin-on resist.

20. The method according to claim 18, wherein the first spacers are pulled back by wet cleaning by applying a dilute hydrogen fluoride (dHF), the method further comprising:
    depositing a second LTO over the gate electrode and the second spacers; and
    reactive ion etching (RIE) the second LTO to form a third spacer on each second spacer, the second and third spacers forming an outwardly tapered composite spacer.

* * * * *